United States Patent
Van Duzer et al.

(10) Patent No.: US 6,734,454 B2
(45) Date of Patent: May 11, 2004

(54) INTERNALLY SHUNTED JOSEPHSON JUNCTION DEVICE

(75) Inventors: Theodore Van Duzer, El Cerrito, CA (US); Xiaoxan Meng, El Cerrito, CA (US); Nathan Newman, Scottsdale, AZ (US); Lei Yu, Tempe, AZ (US); Anupama Bhat Kaul, Pasadena, CA (US)

(73) Assignees: The Regents of the University of California, Oakland, CA (US); The Arizona Board of Regents, Tempe, AR (US)

( * ) Notice: Subject to any disclaimer, the term of this patent is extended or adjusted under 35 U.S.C. 154(b) by 0 days.

(21) Appl. No.: 10/229,354

(22) Filed: Aug. 26, 2002

(65) Prior Publication Data

US 2003/0038286 A1 Feb. 27, 2003

Related U.S. Application Data

(60) Provisional application No. 60/315,184, filed on Aug. 27, 2001.

(51) Int. Cl.$^7$ ................................................. H01L 29/06
(52) U.S. Cl. ............................ 257/31; 257/34; 257/35; 365/162; 505/162; 505/190; 505/329
(58) Field of Search ................... 257/31–36, E39.003, 257/E39.012, E39.014; 365/162; 505/162, 190, 191, 329, 330, 702, 817, 832, 874

(56) References Cited

U.S. PATENT DOCUMENTS

| 5,627,139 A | 5/1997 | Chin et al. |
| 6,066,600 A | 5/2000 | Chan |
| 6,324,413 B1 | 11/2001 | Simon et al. |

OTHER PUBLICATIONS

Van Duzer et al., "Engineering issues in high–frequency RSFQ circuits", Mar. 18, 2002, Physica C.*
Van Duzer et al., "Engineering Issues in High–Frequency RSFQ Circuits," Physica, PHYSC 12201, Mar. 2002.

* cited by examiner

Primary Examiner—Nathan J. Flynn
Assistant Examiner—Scott R Wilson
(74) Attorney, Agent, or Firm—Beyer Weaver & Thomas, LLP

(57) ABSTRACT

A Josephson junction has inherent resistance which effectively shunts the junction and thereby obviates a separate shunt resistor and thus reduces surface area in an integrated circuit including a plurality of Josephson junctions. The Josephson junction comprises a stacked array of layers of Nb and a superconductor with $T_c > 9°$ K having a penetration depth greater than that of Nb, for example $Nb_yTi_{1-y}N$, with a layer of a conducting material having a resistivity between 200 $\mu\Omega$-cm, 1 $\Omega$-cm, such as $Ta_xN$ in the stack. The Josephson junction can be formed on a supporting substrate such as silicon with a ground plane such as Nb on the substrate and an insulating layer such as $SiO_2$ separating the ground plane from the stacked array.

22 Claims, 2 Drawing Sheets

INTERNALLY SHUNTED JOSEPHSON JUNCTION DEVICE

CROSS-REFERENCES TO RELATED APPLICATIONS

This application claims priority from provisional application serial No. 60/315,184, filed Aug. 27, 2001.

STATEMENT AS TO RIGHTS TO INVENTIONS MADE UNDER FEDERALLY SPONSORED RESEARCH OR DEVELOPMENT

The U.S. Government has rights in the disclosed invention pursuant to Office of Naval Research Contract No. N00014-00-1-0003 to the University of California at Berkeley and Contracts No. N00014-96-1-1002 and No. N00014-00-1-0783 to Arizona State University at Tempe, Ariz.

BACKGROUND OF THE INVENTION

This invention relates generally to superconductor circuits and devices, and in particular the invention relates to Josephson Junction Devices used in superconductive integrated circuits.

Chapter 4 of Superconductive Devices and Circuits, 2nd Ed. (by T. Van Duzer and C. W. Turner) Prentice Hall, 1999, describes superconducting Josephson devices. When a direct current (DC) voltage (V) is applied to two superconductors separated by a very thin insulating layer or a conducting material, the frequency of the alternating current (AC) voltage developed between the superconductors is equal to 2 eV/h where e is the electric charge and h is Planck's constant. Current flows through the insulator by tunneling or through the conducting layer by "proximity coupling." This effect is called the Josephson effect. Its applications include high speed switching of logic circuits and memory cells (well under 100 ps), parametric amplifiers operating up to at least 300 gigahertz (GHz), and maintenance of the U.S. legal volt at the National Institute of Standards and Technology. The Josephson devices used in integrated circuits are required to be controllable and repeatable. Also, they need to have a large product of critical current ($I_c$) and normal resistance ($R_n$), or $I_c R_n$, to be useful for high speed operation. Pulse widths are approximately inversely proportional to $I_c R_n$; and reduced pulse width allows operation at higher frequencies.

Most existing applications of superconductor electronics currently use niobium for the interconnections and resistively shunted Nb/AlO$_x$/Nb Josephson tunnel junctions as the active devices. Niobium is preferred over other materials for interconnections because of its chemical and physical stability and because a key parameter called the London penetration depth, has an advantageous value compared with, for example, niobium nitride, or the so called "high-temperature superconductors."

FIG. 1 is a plan view of a conventional Nb/AlO$_x$/Nb Josephson junction device including a tunnel junction 10 between a niobium conductor 12 and overlying niobium conductor 14 with a shunt resistor 16 connected between conductor 12 and conductor 14 in parallel with tunnel junction 10. Resistor 16 uses considerable space in an integrated circuit thus reducing circuit density and introducing parasitic inductance that degrades circuit performance and introduces complexities in circuit design.

The present invention provides a Josephson junction device which can be readily employed in single flux quantum logic circuits and superconducting quantum interference devices (SQUIDS).

BRIEF SUMMARY OF THE INVENTION

In accordance with the invention, a Josephson junction device is provided which has internal shunt resistance, thus obviating an external shunt resistor. The device requires less surface space in an integrated circuit and reduces parasitic inductances. The device has applications in which current-voltage characteristics must be nonhysteretic and for which a large value of the product of the critical current and the normal state resistance ($I_c R_n$) is desired.

Briefly, in one embodiment the Josephson junction device comprises five layers, including two outer layers of Nb with layers of Nb$_y$Ti$_{1-y}$N, Ta$_x$N, and Nb$_y$Ti$_{1-y}$N (where 0.2<y<1 and 0.2<x<2) therebetween. Here the Nb$_y$Ti$_{1-y}$N is illustrative of a more general superconductor with $T_c$>9° K and penetration depth greater than that of Nb, and Ta$_x$N is illustrative of a conducting material with a resistivity between 200 $\mu\Omega$-cm and 1 $\Omega$-cm. One layer of Nb can be supported on an insulating layer such as silicon dioxide over a superconductive ground plane on a silicon substrate. In this embodiment, all layers are thin films with film thicknesses in the range of 100–200 nanometers, except for the barrier material (typically, Ta$_x$N with 0.2<x<2), which can be in the range of 10–500 nanometers.

The invention and objects and features thereof will be more readily apparent from the following detailed description and appended claims when taken with the drawing.

DETAILED DESCRIPTION OF THE INVENTION

Figure 1:
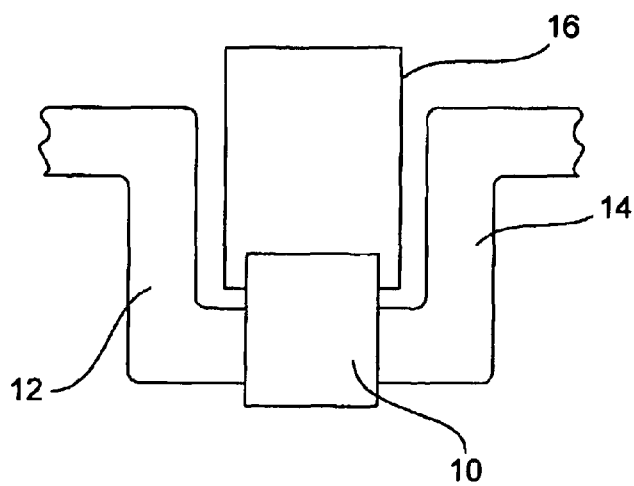
FIG. 1 is a plan view of a prior art Josephson device and shunt resistance.
Figure 2:
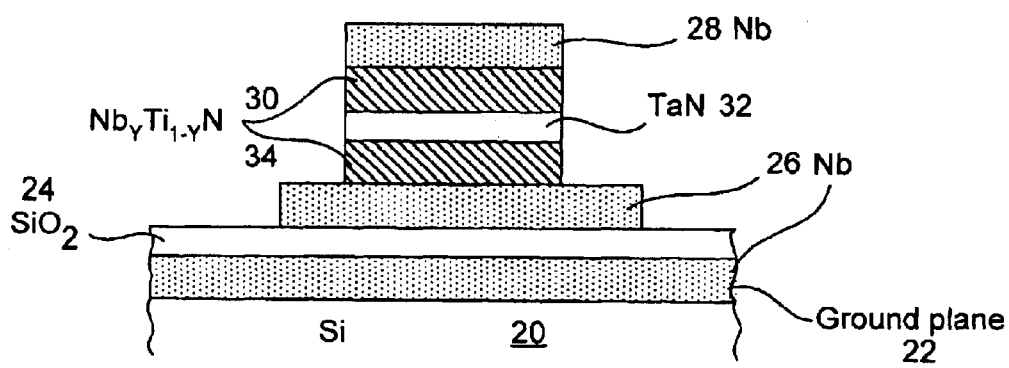
FIG. 2 is a section view of a Josephson junction device in accordance with one embodiment of the invention.

FIG. 2 is a section view of five-layer Josephson junction device in accordance with one embodiment of the present invention. The surface area of the device is equivalent to the surface area of tunnel junction 10 in FIG. 1 without the need for a separate shunt resistor 16 since the internal resistance of the junction provides the shunt resistance.

In this embodiment the device is formed on a silicon substrate 20 having a Nb ground plane 22 formed on one surface with a silicon oxide layer 24 deposited over the ground plane. The Josephson junction device comprises five layers including an Nb layer 26 formed on the surface of silicon oxide layer 24 and a top Nb contact layer 28 with an Nb$_y$Ti$_{1-y}$N layer 30, a Ta$_x$N layer 32, and a second Nb$_y$Ti$_{1-y}$N layer 34 sandwiched between Nb layers 26 and 28.

All of the metal layers and the SiO$_2$ layer are thin films formed by sputtering or vapor deposition with the film thicknesses being in the range of 100–200 nanometers, except for the Ta$_x$N barrier layer 32 which is preferably in the range of 10–100 nanometers. The resistivity of the barrier is one of the variables, and the properties of the junction depends on the resistivity as well as the barrier thickness. The achievable $I_cR_n$ with the five-layer structure exceeds 2 mV.

Figure 3A:
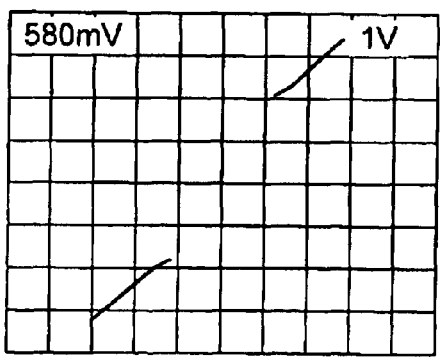
FIGS. 3A, 3B are graphs of I-V characteristics of two Josephson junction devices in accordance with the invention.
Figure 3B:
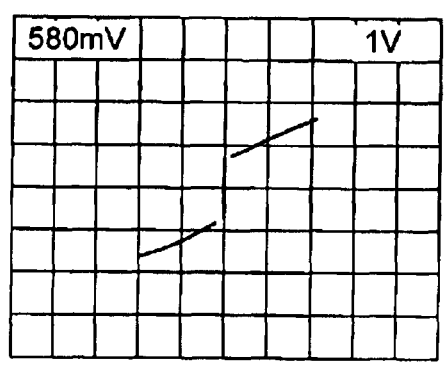

FIGS. 3A and 3B are graphs illustrating current (I) versus voltage (V) characteristics for two devices in accordance with the invention. In FIG. 3A, the characteristics are for an operating temperature of 4.2° K with $I_cR_n$=2.4 mV. Current, I, is 0.5 mA/div along the ordinate and voltage, V, is 1 mV/div, along the abscissa. In FIG. 3B, the characteristics are for an operating temperature of 6.8° K and with $I_cR_n$2.1 mV. Again, current, I, is 0.5 mA/div on the ordinate and voltage, V, is 1 mV/div, along the abscissa.

Eight runs have been completed in which entire 4-inch wafers were coated with the pentalayer film structure and which were processed to form individual junctions and arrays of junctions.

The I-V characteristics are shown in FIG. 3B for one of the junctions. A measurement of another junction with a current density of about 15 kA/cm² showed the important parameter $I_cR_n$ to have the high value of 2.0 mV. This means that the junction itself would not limit circuit operation for frequencies up to about 300 GHz.

Figure 4:
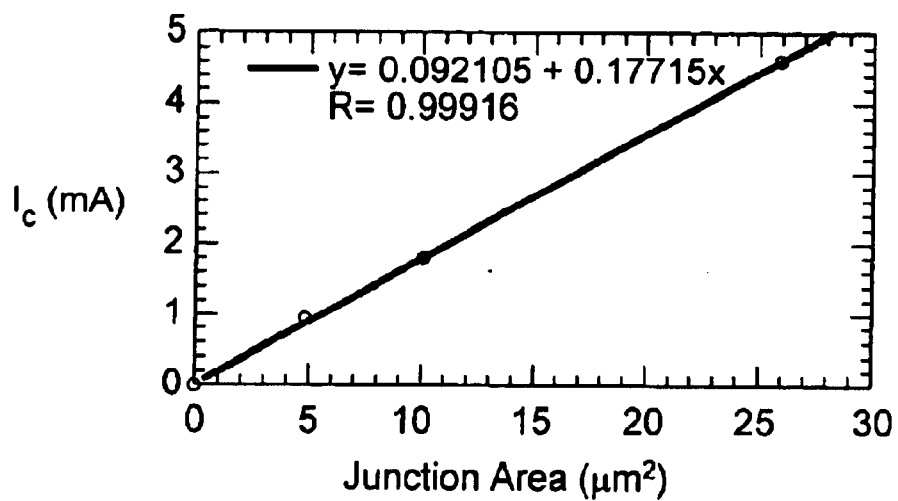
FIG. 4 is a graph illustrating dependence of critical current on junction area.

The effect on the junction critical current of magnetic field passing along the plane of the $Ta_xN$ barrier has been observed. As expected, magnetic field reduces the critical current. FIG. 4 shows the dependence of the critical currents on the junction area. It is proportional to the area, as expected for junctions small enough that the self-fields of the Josephson current do not appreciably suppress the current.

Figure 5:
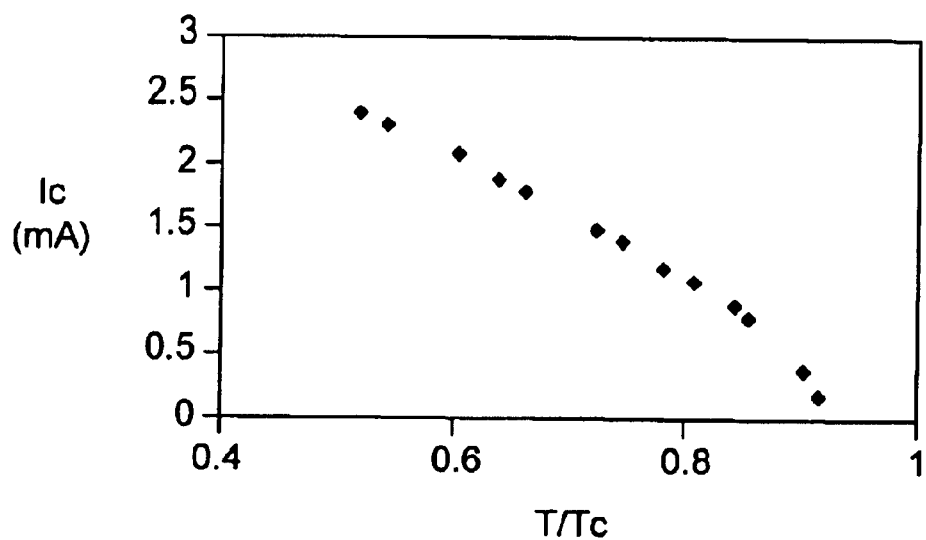
FIG. 5 is a graph illustrating dependence of critical current on temperature.

Measured temperature dependence of the critical current is shown in FIG. 5. It is believed that the variation with temperature, at the operating temperature of 4° K, can be reduced (as is desirable for applications) by using more resistive $Ta_xN$ in the junction barrier.

Microwave induced steps in the I-V characteristic have been observed with the expected voltage-frequency Josephson relation.

A pentalayer Josephson junction device in accordance with the invention has high $I_cR_n$ product for higher frequency operation and the small surface area makes the device an ideal drop-in replacement for the conventional resistively shunted tunnel junction device. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A Josephson junction comprising first and second niobium (Nb) layers separated by a first layer of niobium titanium nitride ($Nb_yTi_{I-y}N$) on a layer of tantalum nitride ($Ta_xN$), on a second layer of $Nb_yTi_{I-y}N$.

2. The Josephson junction as defined by claim 1 wherein the layer of $Ta_xN$ has an inherent resistance which effectively shunts the junction.

3. The Josephson junction as defined by claim 2 wherein the first $Nb_yTi_{I-y}N$ layer abuts the first Nb layer and the second $Nb_yTi_{I-y}N$ layer abuts the second Nb layer.

4. The Josephson junction as defined by claim 3 wherein the Nb and $Nb_yTi_{I-y}N$ layers are in the range of 100–200 nanometers in thickness and the $Ta_xN$ layer is in the range of 10–100 nanometers in thickness.

5. The Josephson junction as defined by claim 4 wherein all layers are formed by sputtering.

6. A Josephson junction device comprising
   a) a supporting substrate,
   b) a conductive ground plane on the supporting substrate,
   c) an electrically insulating layer on the ground plane,
   d) a first niobium (Nb) layer on the ground plane,
   e) a first niobium titanium nitride ($Nb_yTi_{I-y}N$) layer on the first Nb layer,
   f) a tantalum nitride ($Ta_xN$) barrier layer on the first $Nb_yTi_{I-y}N$ layer,
   g) a second $Nb_yTi_{I-y}N$ layer on the $Ta_xN$ layer, and
   h) a second Nb layer on the second $Nb_yTi_{I-y}N$ layer.

7. The device as defined by claim 6 wherein the Nb and $Nb_yTi_{I-y}N$ layers are in the range of 100–200 nanometers in thickness, and the $Ta_xN$ layer is in the range of 10–100 nanometers in thickness.

8. The Josephson junction device as defined by claim 7 wherein the conductive ground plane comprises Nb.

9. The Josephson junction device as defined by claim 8 wherein the supporting substrate is a semiconductor.

10. The Josephson junction device as defined by claim 9 wherein the semiconductor is silicon.

11. A Josephson junction device as defined by claim 10 wherein the electrically insulating layer comprises silicon oxide.

12. A Josephson junction comprising a stacked array of niobium (Nb) and niobium titanium nitride ($Nb_yTi_{I-y}N$) layers with a tantalum nitride ($Ta_xN$) barrier layer in the stacked array whereby the stacked array has inherent resistance which effectively shunts the junction.

13. The Josephson junction as defined by claim 12 wherein the Nb and $Nb_yTi_{I-y}N$ layers are in the range of 100–200 nanometers in thickness, and the $Ta_xN$ layer is in the range of 10–100 nanometers in thickness.

14. The Josephson junction as defined by claim 13 wherein all layers are formed by sputtering.

15. The Josephson junction as defined by claim 14 and further including a supporting substrate having a conductive ground plane thereon and an electrically insulating layer on the ground plane, the stacked array being formed on the electrically insulating layer.

16. The Josephson junction as defined by claim 15 wherein the substrate comprises silicon, the ground plane comprises Nb, and the electrically insulating layer comprises $SiO_2$.

17. The Josephson junction as defined by claim 12 and further including a supporting substrate having a conductive ground plane thereon and an electrically insulating layer on the ground plane, the stacked array being formed on the electrically insulating layer.

18. The Josephson junction as defined by claim 17 wherein the substrate comprises silicon, the ground plane comprises Nb, and the electrically insulating layer comprises $SiO_2$.

19. A Josephson junction device comprising first and second layers of niobium (Nb) separated by a first layer of a superconductor having $T_c$ greater than 9° K and a penetration depth greater than that of Nb on a layer of a conducting material having a resistivity between 200 $\mu\Omega$-cm and 1 $\Omega$-cm which is on a second layer of the superconductor.

20. The Josephson junction device as defined by claim 19 wherein the conducting material comprises tantalum nitride ($Ta_xN$).

21. The Josephson junction device as defined by claim 20 wherein the superconductor comprises niobium titanium nitride ($Nb_yTi_{I-y}N$).

22. The Josephson junction device as defined by claim 19 wherein the superconductor comprises niobium titanium nitride ($Nb_yTi_{I-y}N$).

* * * * *